(12) United States Patent
Saputra et al.

(10) Patent No.: US 10,305,361 B2
(45) Date of Patent: May 28, 2019

(54) LOW VOLTAGE INPUT CALIBRATING DIGITAL TO ANALOG CONVERTER

(71) Applicant: QUALCOMM Incorporated, San Diego, CA (US)

(72) Inventors: Nitz Saputra, San Bruno, CA (US); Sang Min Lee, San Diego, CA (US); Dongwon Seo, San Diego, CA (US); Vinay Kundur, San Diego, CA (US); Behnam Sedighi, La Jolla, CA (US); Honghao Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/710,704

(22) Filed: Sep. 20, 2017

(65) Prior Publication Data

US 2018/0358883 A1 Dec. 13, 2018

Related U.S. Application Data

(60) Provisional application No. 62/517,700, filed on Jun. 9, 2017.

(51) Int. Cl.
| | |
|---|---|
| *H03M 1/20* | (2006.01) |
| *H02M 1/00* | (2006.01) |
| *H02J 5/00* | (2016.01) |
| *H02M 1/14* | (2006.01) |
| *H03M 1/00* | (2006.01) |

(52) U.S. Cl.
CPC .............. *H02M 1/00* (2013.01); *H02J 5/00* (2013.01); *H02M 1/143* (2013.01); *H03M 1/00* (2013.01); *H02M 2001/0006* (2013.01); *H02M 2001/0012* (2013.01)

(58) Field of Classification Search
CPC .......... H02M 1/00; H02M 1/006; H02M 1/143
USPC ........ 341/118, 120, 144, 155, 145, 156, 135
See application file for complete search history.

(56) References Cited

U.S. PATENT DOCUMENTS

| | | | |
|---|---|---|---|
| 7,129,871 B1 | 10/2006 | Venes et al. | |
| 7,202,744 B1* | 4/2007 | Manganaro | H03F 1/303 330/288 |
| 7,528,752 B1 | 5/2009 | Chern | |
| 8,816,889 B2 | 8/2014 | Teterwak | |
| 8,928,513 B1 | 1/2015 | Waltari | |
| 2010/0117876 A1* | 5/2010 | Cao | H03M 1/1061 341/118 |
| 2010/0283773 A1* | 11/2010 | Kim | G09G 3/20 345/211 |
| 2011/0115659 A1* | 5/2011 | Chern | H03M 1/1019 341/118 |

(Continued)

*Primary Examiner* — Peguy Jean Pierre
(74) *Attorney, Agent, or Firm* — Seyfarth Shaw LLP

(57) ABSTRACT

A calibrating digital to analog converter (calDAC) architecture uses a low voltage memory to store the digital inputs of calDACs. The calDAC architecture includes a low voltage domain and a high voltage domain coupled to the low voltage domain. The low voltage domain includes a calDAC memory and a finite state machine (FSM). The high voltage domain includes a calDAC core, an interface circuit, and a bias control circuit coupled to the interface circuit. The interface circuit may be provided between the calDAC core and the low voltage domain. The bias control circuit is coupled to the interface circuit to generate a bias voltage for the interface circuit to drive switch transistors of the calDAC core.

18 Claims, 11 Drawing Sheets

(56) References Cited

U.S. PATENT DOCUMENTS

2012/0293349 A1* 11/2012 Chen .................. H03M 1/1014
341/120
2015/0220100 A1 8/2015 Zhu et al.

* cited by examiner

LOW VOLTAGE INPUT CALIBRATING DIGITAL TO ANALOG CONVERTER

CROSS-REFERENCE TO RELATED APPLICATION

The present application claims the benefit of U.S. Provisional Patent Application No. 62/517,700, filed on Jun. 9, 2017, and titled "LOW VOLTAGE INPUT N-TYPE METAL OXIDE SEMICONDUCTOR CALIBRATING DIGITAL TO ANALOG CONVERTER," the disclosure of which is expressly incorporated by reference herein in its entirety.

TECHNICAL FIELD

The present disclosure generally relates to a device for calibrating a digital to analog converter. More specifically, the present disclosure relates to a low voltage input N-type metal oxide semiconductor (NMOS) calibrating digital to analog converter (calDAC).

BACKGROUND

Digital to analog converters (DACs) are utilized in a wide variety of applications (e.g., transmit DAC, envelope tracking DAC, and wireless local area network (WLAN) DAC). DACs can be susceptible to various types of errors including, but not limited to, errors related to current or voltage source mismatches, gain and offset errors, as well as errors caused by external signal paths. To achieve improved performance in the areas of signal-to-noise and distortion ratio (SNDR), total harmonic distortion (THD), and spurious free dynamic range (SFDR), self-calibration techniques are utilized to calibrate the output provided by a DAC.

One self-calibration technique includes a binary weighted configuration. For example, a P-type metal oxide semiconductor (PMOS) calDAC may be implemented in a binary weighted configuration to achieve improved performance of DACs. Each input digital bit of the binary weighted configuration controls a particular amount of analog binary weight, which is added/subtracted to/from an output of the binary weighted configuration. However, memory of the PMOS calDAC is implemented in a high voltage domain (e.g., VDD of 1.8V) and the memory occupies a large space of the calDAC (e.g., about fifty percent (50%) of the PMOS calDAC area). On the other hand, memory can be placed in a low voltage domain to reduce its area, but the PMOS calDAC in this case includes bulky level shifters that occupy an increased amount of chip area.

SUMMARY

A calibrating digital to analog converter (calDAC) architecture may include a low voltage domain and a high voltage domain coupled to the low voltage domain. The low voltage domain includes a calibrating digital to analog converter memory. The high voltage domain includes a calibrating digital to analog converter core, an interface circuit between the calibrating digital to analog converter core and the low voltage domain, and a bias control circuit coupled to the interface circuit. The bias circuit generates a bias voltage for the interface circuit to drive switch transistors of the calibrating digital to analog converter core.

A method of calibrating a digital to analog converter may include generating a bias voltage to an interface circuit to drive switch transistors of an N-type metal oxide semiconductor (NMOS) calibrating digital to analog converter (calDAC) core. The NMOS calDAC core may reside within a high voltage domain. The interface circuit may be coupled between the high voltage domain and a low voltage domain, which includes a memory for the NMOS calDAC core. The method also includes generating a correction current based on the bias voltage and an error code generated by the low voltage domain at an output of the NMOS calDAC core. The method further includes combining the correction current with an output current of a main digital to analog converter.

According to a further aspect of the present disclosure, a calibrating digital to analog converter (calDAC) architecture may include a low voltage domain and a high voltage domain coupled to the low voltage domain. The low voltage domain includes a calibrating digital to analog converter memory. The high voltage domain includes a calibrating digital to analog converter core, means for interfacing the calibrating digital to analog converter core and the low voltage domain, and means for generating a bias voltage to an interface circuit to drive switch transistors of the calDAC core.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
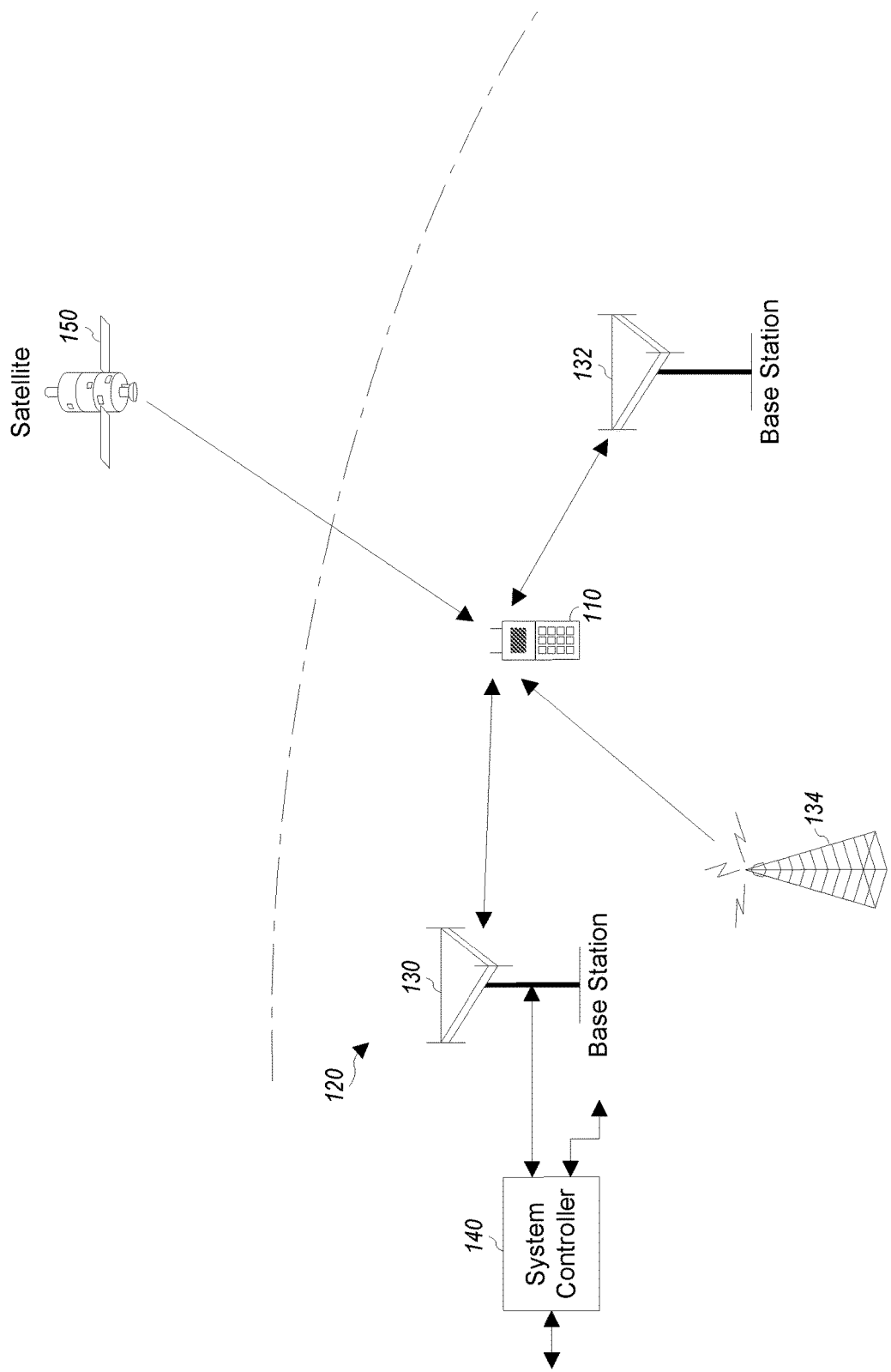
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Calibration enables an electronic system (e.g., a digital to analog converter (DAC)) to improve its performance autonomously without depending on external resources. A calibrating digital to analog converter (calDAC) allows for trimming of a value of a DAC element of a main DAC in discrete steps by adding/subtracting a small correction current to a main current source or an output current of the main DAC. The calDAC operates in parallel with a main DAC. During calibration, a current difference between a DAC element and a reference device is digitized. A comparator decides whether current of a selected DAC element of the main DAC is smaller or larger than a reference current provided by the reference device. This digital information is then used by control logic to set the calDAC (e.g., with a digital register or memory to store the digital information for setting the calDAC).

For example, the current of the selected DAC element is sent to the comparator input to be measured against the reference current. The difference of these currents, which is the error current, is measured and converted to a digital code in accordance with a successive approximation register implementation. The generated digital codes (or error codes) are then stored and organized in memory. For example, a digital input to the DAC addresses the memory to access the proper error code to be loaded into the calDAC. The calDAC then adds or subtracts the necessary current at the output of the DAC to eliminate the current amplitude errors due to random mismatch. For example, the calDAC corrects most significant bit (MSB) current source mismatch in a fourteen bit (14-bit) transmit DAC with six bit (6-bit) MSB and eight bit (8-bit) least significant bit (LSB) segmentation. A small current can be added (e.g., when a PMOS calDAC is used) or subtracted (e.g., when a NMOS calDAC is used) at the output of each MSB.

Aspects of the present disclosure are directed to a calibrating digital to analog converter (calDAC) architecture that is area efficient and uses a low voltage memory to store digital inputs of calDACs. In one aspect, the calDAC architecture includes a low voltage domain and a high voltage domain coupled to the low voltage domain. The low voltage domain (e.g., a digital domain) may include a calDAC memory and a finite state machine (FSM). A low-pass filter may be included in the calDAC memory to suppress noise from the low voltage supply. The high voltage domain (e.g., an analog domain) includes a calibrating digital to analog converter (calDAC) core, an interface circuit, and a bias control circuit coupled to the interface circuit. The interface circuit may be provided between the calDAC core and the low voltage domain. In one aspect, the calDAC core is an N-type metal oxide semiconductor (NMOS) calDAC core.

The bias control circuit is coupled to the interface circuit to generate a bias voltage to the interface circuit, in which the bias voltage drives switch transistors of the calDAC core. The arrangement of the bias control circuit causes the switch transistors to be in a cascode configuration instead of being driven solely by a voltage from a power supply (e.g., VDDA and ground). For example, the interface circuit may include the switch transistors configured in accordance with a cascode implementation where all or some of the switch transistors of the calDAC are biased by a voltage from the interface circuit, rather than a high supply voltage VDDA or ground.

In one aspect of the disclosure, the bias control circuit includes bias/control transistors arranged as a current mirror to track current source transistors of the calDAC core. The bias voltage to the switch transistors is based on a tracked gate to source voltage of the current source transistors plus gate to source voltage of a replica of the switch transistors. This arrangement guarantees that the DC operating points of all current sources in the calDAC core (in terms as Vgs and Vds) match those of the bias current (as current reference) over process, supply, and temperature variation. The bias circuit could be shared over multiple calDACs. In one aspect of the disclosure, the interface circuit includes buffers to facilitate biasing of the switch transistors of the calDAC core, to provide noise isolation from the low voltage domain, and to level-shift digital signals from the memory to the calDAC core.

In one aspect of the disclosure, the switch transistors are biased based on tracking of an operation condition of the current source transistors (e.g., of the NMOS calDAC core in the high voltage domain). For example, the transistors of the bias control circuit are arranged such that the current source transistors of the calibrating digital to analog converter core tracks a biasing condition (e.g., process, supply, and temperature variation) of a reference transistor.

The bias voltage for the switch transistors may be buffered using a source-follower configuration to get faster settling time at an output of one or more buffers of the interface circuit and to tolerate leakage current from the one or more buffers without affecting the reference bias current.

The calibrating digital to analog converter (calDAC) architecture is area efficient. To achieve the area efficiency, the calDAC memory is implemented in the low voltage domain with the FSM. This arrangement also has the added benefit of speeding up the calibration process.

Figure 12:
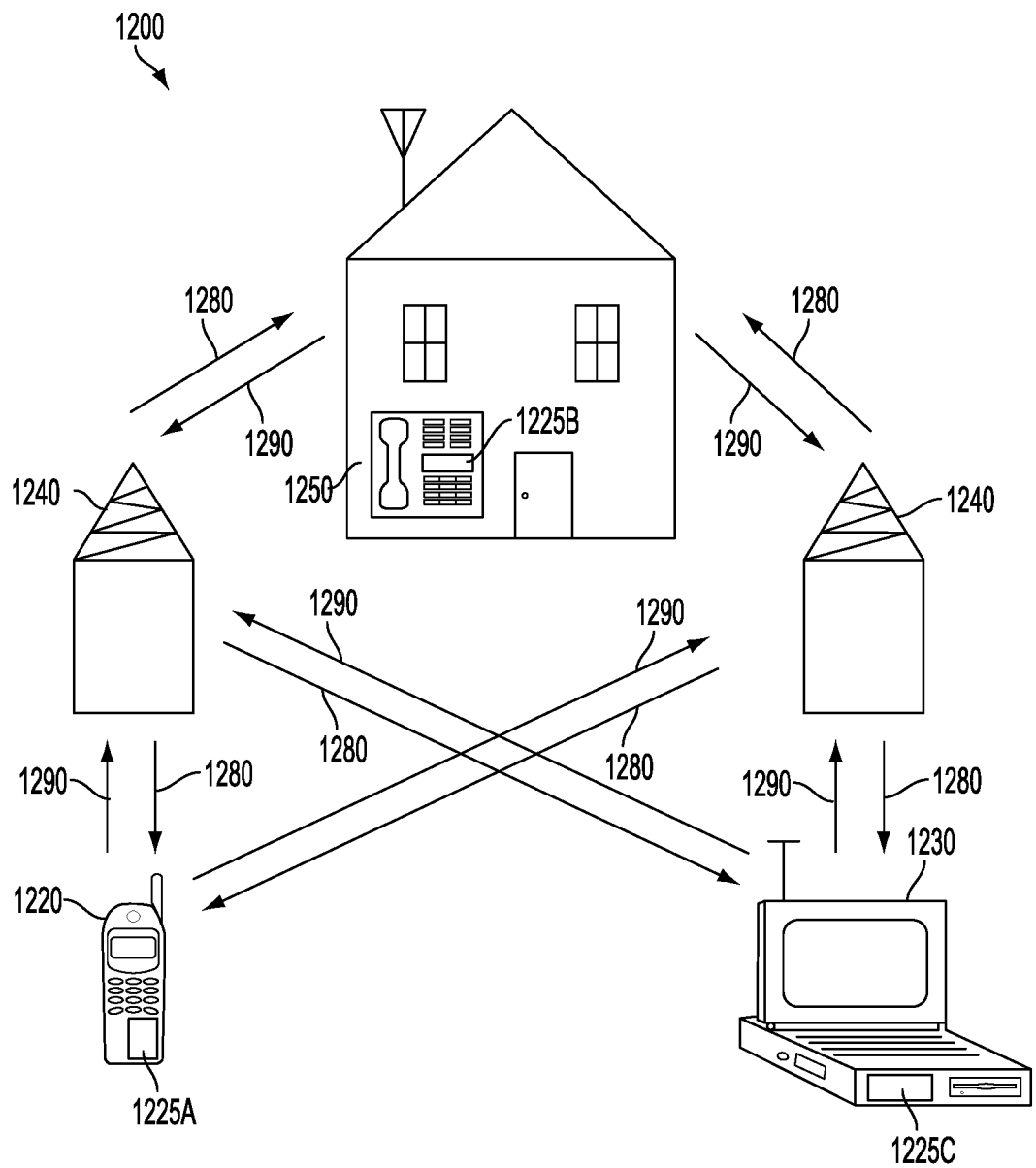
FIG. 12 is a block diagram showing an exemplary wireless communication system in which a configuration of the disclosure may be advantageously employed.

The aspects of the present disclosure may be implemented in the system of FIGS. 1 and 12. More specifically, aspects of the present disclosure may be implemented in the wireless device of FIG. 2.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
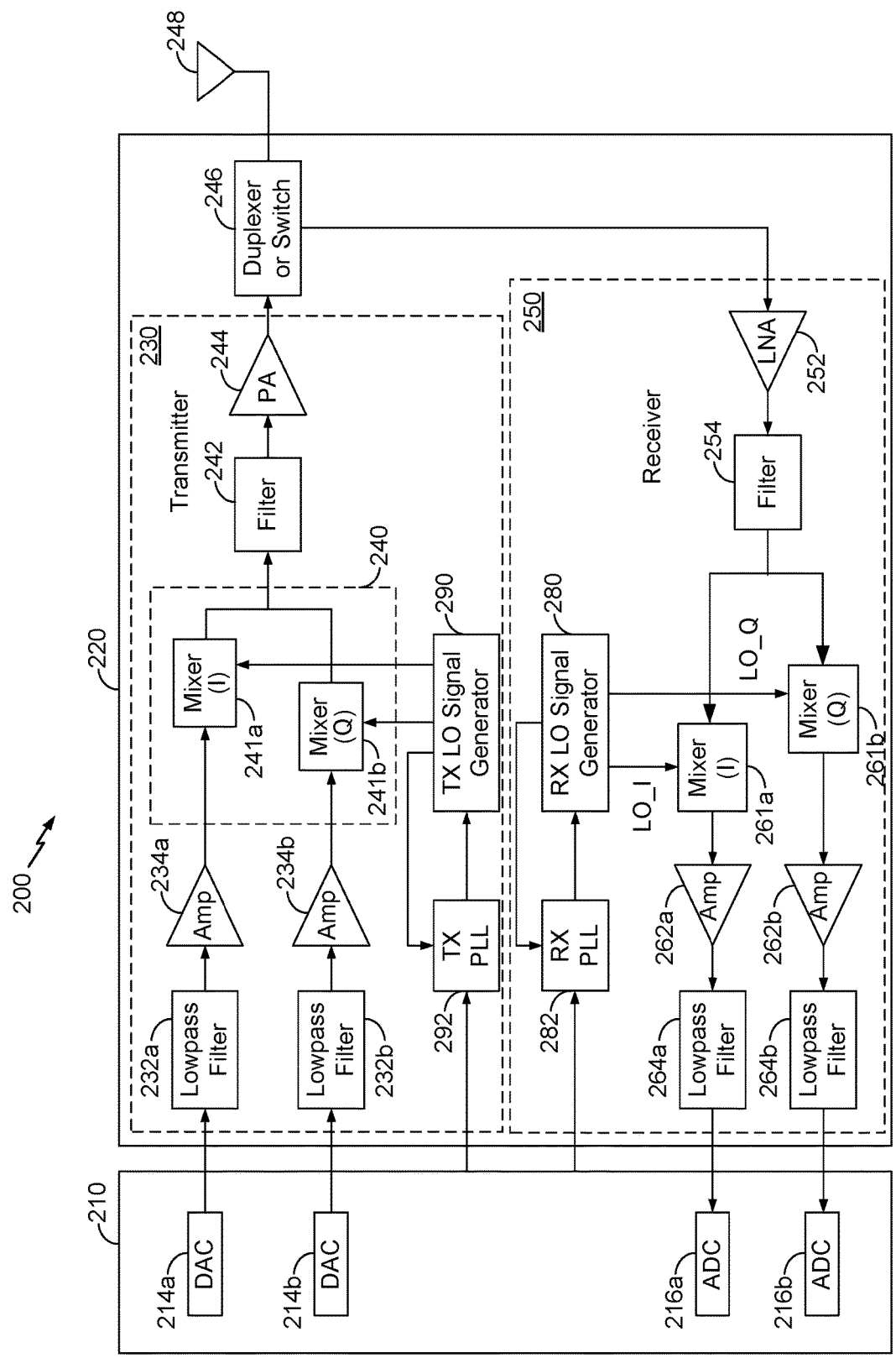
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital to analog converters (DACs) 214a and 214b for converting digital signals generated by the data processor 210 into the in-phase (I) and quadrature (Q) analog output signals (e.g., I and Q output currents) for further processing.

Within the transmitter 230, low-pass filters 232a and 232b filter the in-phase (I) and quadrature (Q) analog transmit signals, respectively, to reduce undesired images caused by the prior digital to analog conversion. Amplifiers (Amp) 234a and 234b amplify the signals from low-pass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by low-pass filters 264a and 264b to obtain in-phase (I) and quadrature (Q) analog input signals, which are provided to the data processor 210. In the exemplary configuration shown, the data processor 210 includes analog to digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
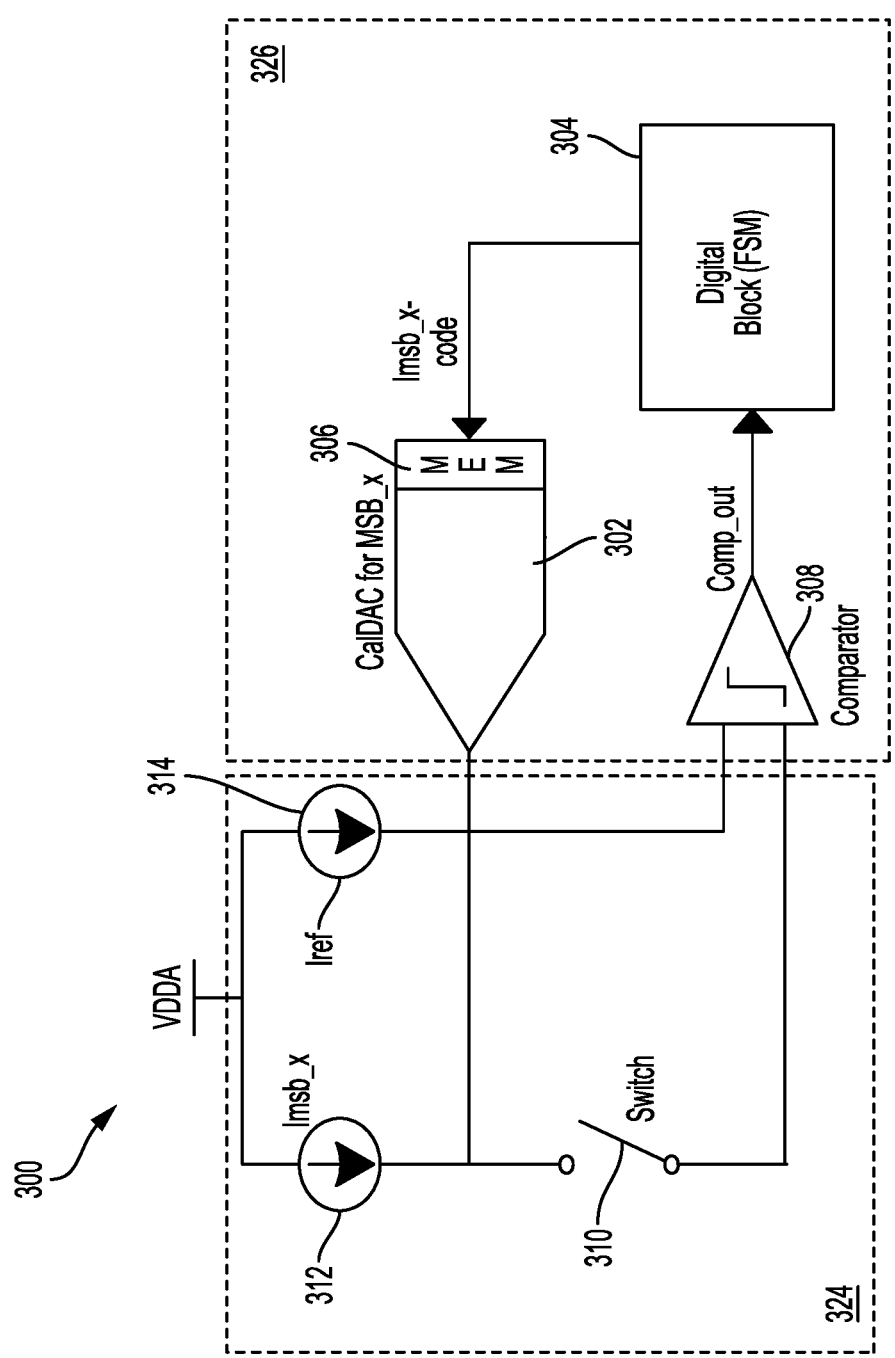
FIG. 3 illustrates a calibrating digital to analog converter (DAC) circuit according to aspects of the present disclosure.

FIG. 3 illustrates a calibrating digital to analog converter (calDAC) system 300 according to aspects of the present disclosure. The calDAC system 300 may include a main DAC (e.g., DAC 214a or 214b of FIG. 2) to be calibrated and a calDAC circuit 326. For example, the main DAC to be calibrated may be incorporated in a DAC device or module 324.

The calDAC circuit 326 includes a calDAC device 302, a digital block 304, and a current comparator circuit 308. The DAC module 324 may include a switch 310, a DAC element current source 312 and a reference current source 314. The calDAC circuit 326 is used to tune different current source values of each DAC element to a desired level.

The calDAC device 302 includes a calDAC memory 306. The digital block 304 may include a state machine (e.g., a digital calibrating finite state machine (FSM)). In this illustration, the digital block 304 is implemented in a low voltage domain while the calDAC device 302 (including a calDAC core and corresponding memory 306) is implemented in a high voltage domain. A voltage supply VDDA in a high voltage domain supplies the DAC element current source 312 and a reference current source 314. The DAC element current source 312 may be a controllable current source and the calDAC circuit 326 tunes the controllable current source. The calDAC circuit 326 compares a current source value provided by a selected controllable current source to a reference current value and adjusts the controllable current source in accordance with the comparison.

The controllable current source may be from various DAC elements or DAC bit elements. The DAC bit elements may include a least significant bit (LSB) element to a most significant bit (MSB) element of the main DAC that is to be calibrated by the calDAC circuit 326. The switch 310 may be configured to select the DAC element to be corrected. For example, the MSB element may be selected and the calDAC circuit 326 is adjusted to compensate for error (of current (Imsb_x) associated with the MSB element). To achieve the adjustment, current (Imsb_x) associated with the MSB element and a reference current (Iref) are compared. For example, the current comparator circuit 308 compares the current source value (Imsb_x) provided by a selected controllable current source to the reference current value (Iref) and provides the result to the FSM. The digital calibrating FSM controls the calibration sequence and adjusts the calDAC memory 306 based on the results from the current comparator circuit 308.

Figure 4:
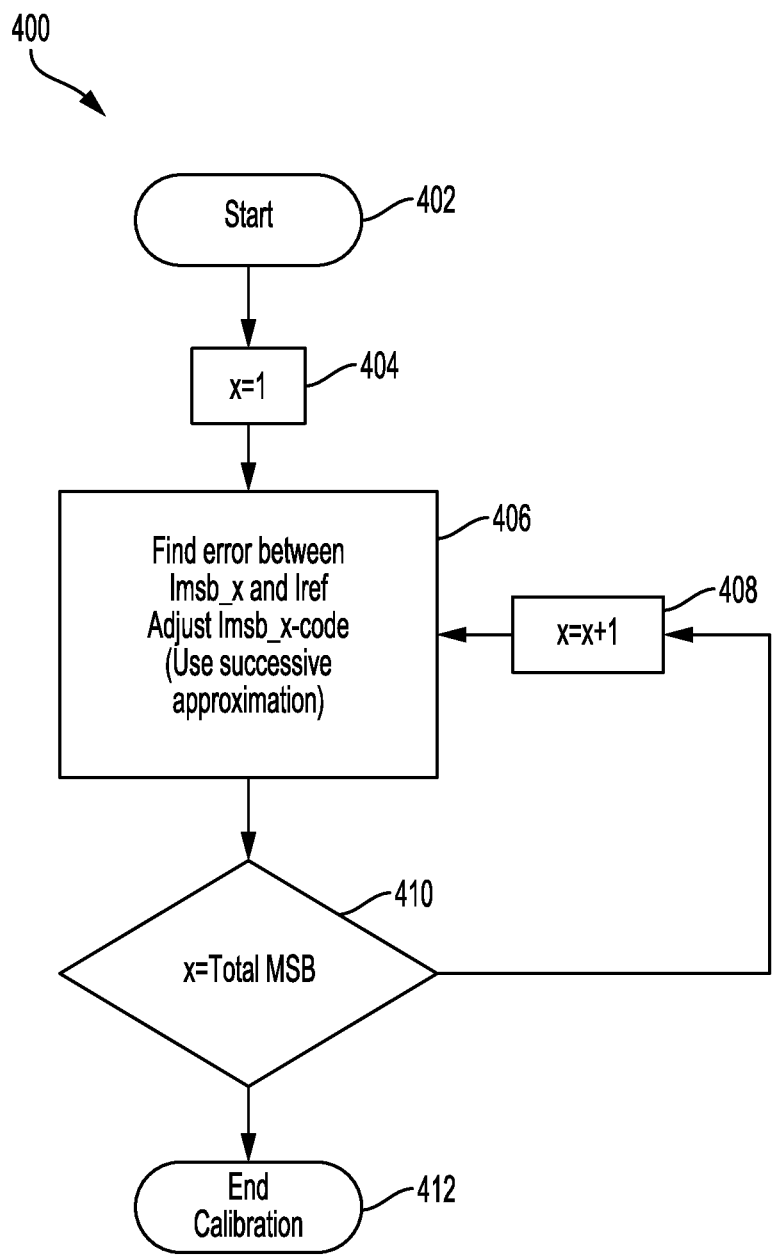
FIG. 4 is a flow diagram of a DAC calibrating method implemented in the calibrating DAC (calDAC) circuit of FIG. 3.

FIG. 4 is a flow diagram of a calibrating DAC method 400 implemented in the calDAC circuit of FIG. 3. The method 400 may be implemented in accordance with a successive approximation register (SAR) implementation. Considering the MSB element, a parameter (x) corresponding to a number of the MSB elements is incrementally increased until a total number of MSB elements are adjusted. For example, the DAC calibrating process starts at block 402. At block 404, the parameter (x) is set to 1. At block 406, error between the current (Imsb_x) associated with the MSB element being processed and the reference current (Iref) is determined. A code associated with the current (Imsb_x) is then adjusted based on the successive approximation implementation. At block 410, it is determined whether the parameter (x) is equal to a total of the MSB elements. If x is not equal to the total of the MSB elements, x is incremented by 1 at block 408 and the process returns to block 406. When x is equal to the total of the MSB elements, the calibrating process ends at block 412.

Figures 5, 6:
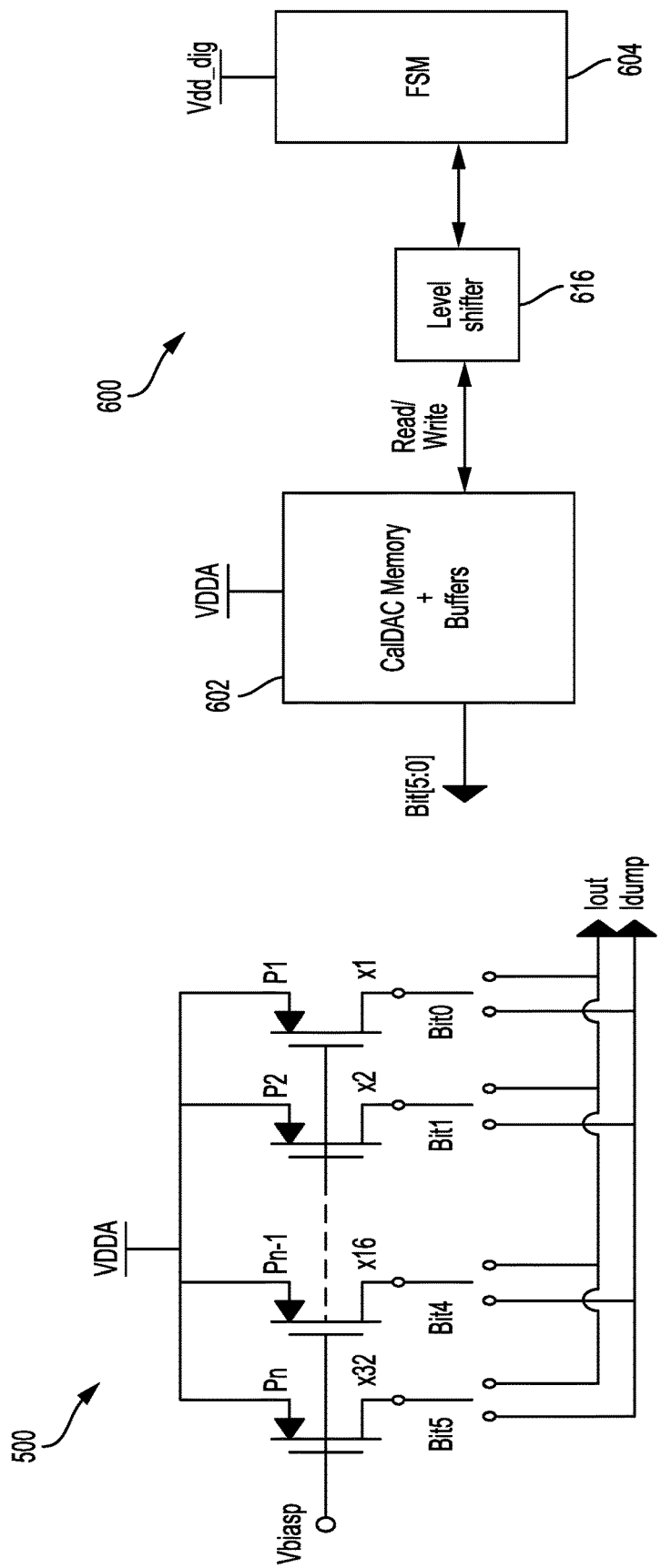
FIG. 5 illustrates a P-type metal oxide semiconductor (PMOS) calDAC core implemented in accordance with a binary weighted configuration.
FIG. 6 illustrates a calibration scheme in which the memory of each calDAC is in a high-voltage domain.

FIG. 5 illustrates a P-type metal oxide semiconductor (PMOS) calDAC core 500 implemented in a binary weighted configuration. The PMOS calDAC core 500 includes multiple PMOS transistors P1, P2, Pn-1, and Pn. The transistors P1, P2, Pn-1, and Pn are current source transistors corresponding to each calDAC element. The transistors of the PMOS calDAC core 500 are configured in accordance with a binary weighted configuration. For example, the current source transistors are in a binary configuration using a unit current source as a least significant bit (LSB) current source. For example, a 6-bit (bit 0, bit 1, bit 2, bit 3, bit 4 and bit 5) calDAC includes two to the fifth power ($2^5$) unit current sources in parallel for the most significant bit (MSB) current source. Thus, a total unit current source is given by $2^0$ (=1)+$2^1$ (=2)+$2^2$ (=4)+ . . . +$2^5$ (=32)=63 unit current sources. This binary weighted configuration results in an increased number of transistors for the calDAC array in the PMOS calDAC core 500.

In a binary-weighted configuration of the calDAC, the unit current source is specified to be sized adequately (such that it is not an arbitrarily small size) to limit a mismatch error between its current source. For example, the binary-weighted configuration of the calDAC that uses successive approximation during calibration can be slightly non-linear or have an overlapping transfer function. Having non-linearity due to overlapping in a calDAC transfer function reduces a maximum residual error after the SAR calibration in the presence of current source mismatch in the calDAC, and therefore results in desirable relaxation of the unit current source size specification. Thus, it is desirable to develop an implementation that reduces the size of the calDAC while maintaining or improving performance relative to the binary configuration.

FIG. 6 illustrates a digital circuit 600 for a PMOS calDAC. The digital circuit 600 includes calDAC memory and buffers 602, a finite state machine (FSM) 604 and a level shifter 616. The calDAC memory and buffers 602 are implemented in a high voltage domain relative to the digital block 604 that is implemented in a low voltage domain or digital domain. For example, the calDAC memory and buffers 602 receive a voltage VDDA in accordance with the high voltage domain and the digital block 604 receives a voltage Vdd_dig in accordance with the digital domain. The voltage VDDA may be 1.8V while the voltage Vdd_dig may be 0.8V.

Because the calDAC core (e.g., calDAC core 500) is implemented in PMOS and high voltage domain the digital calDAC memory and buffers 602 are also implemented in high voltage domain and occupy a significant portion (e.g., about fifty percent (50%)) of a total area of the calDAC core and corresponding digital calDAC memory and buffers 602. To achieve this configuration where the digital calDAC memory and buffers 602 are in the high voltage domain, many digital level shifters 616, which are bulky, are specified. In addition, calDAC designs have many challenges including the fact that the calDAC array of transistors occupy a significant portion of a main DAC (e.g., the main DAC 214a). There is also a challenge of keeping a residual error low after calibration that affects the size of the calDAC core 500.

Figure 7:
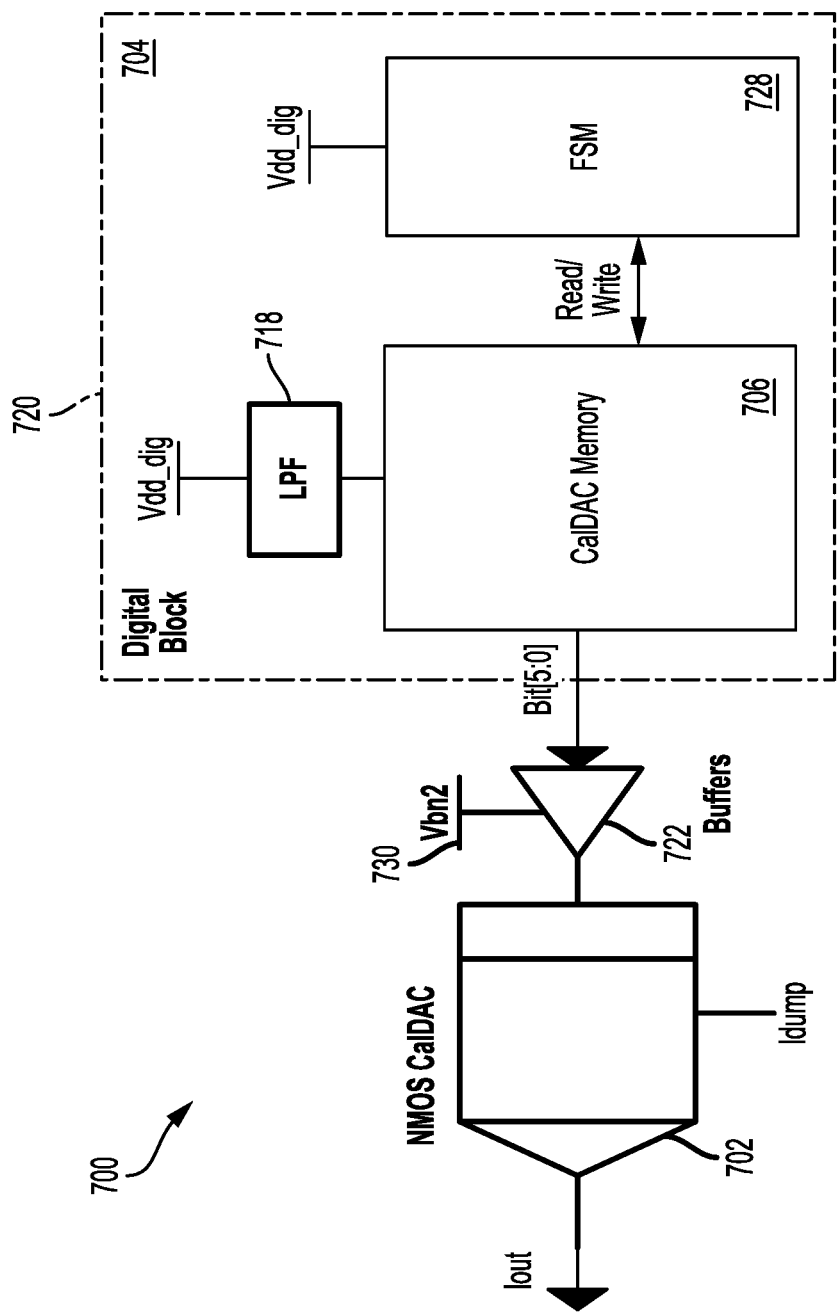
FIG. 7 illustrates an exemplary N-type metal oxide semiconductor (NMOS) calibrating digital to analog converter (calDAC) according to aspects of the present disclosure.

FIG. 7 illustrates an exemplary N-type metal oxide semiconductor (NMOS) calibrating digital to analog converter (calDAC) 700 according to aspects of the present disclosure. In one aspect, the NMOS calDAC 700 is utilized to avoid level shifters, which consume a large area. The NMOS calDAC 700 includes a calDAC core 702, a digital block 704, an interface circuit 722 (e.g., a buffer, inverter, switch or driver circuit) and a bias control circuit 730. The buffers of the interface circuit 722 are added to provide the interface and to bias switch transistors of the calDAC core 702 at Vbn2 and to provide noise isolation from Vdd_dig (Vbn2<Vdd_dig). The NMOS calDAC 700 operates at a relatively low frequency (~10 MHz), so Vbn2 generator does not need to provide low output impedance. The NMOS calDAC 700 includes a low voltage domain (e.g., a digital domain) and a high voltage domain (e.g., an analog domain) coupled to the low voltage domain. The low voltage domain includes the digital block 704. The digital block 704 includes a calDAC memory 706 and a finite state machine (FSM) 728. For example, the calDAC memory 706 is a digital memory implemented in the low voltage domain with digital voltage supply (e.g., Vdd_dig) and synthesized along with the FSM 728 (e.g., a controller) in the digital block 704. This implementation achieves smaller memory sizes and timing closure that can be verified by a digital tool.

The high voltage domain includes the calDAC core 702, the interface circuit 722 and the bias control circuit 730. The high voltage domain receives the high voltage VDDA and the low voltage domain receives the low voltage Vdd_dig. For example, the calDAC memory 706 and the FSM 728 each receive the voltage Vdd_dig in accordance with the digital domain. The calDAC core 702 receives the voltage VDDA. The voltage Vdd_dig is a low voltage relative to the high voltage of VDDA associated with the high voltage domain.

The digital block 704 and corresponding low voltage domain of the NMOS calDAC 700 may also include a filter (e.g., a low-pass filter (LPF) 718) coupled between a low voltage supply that supplies the voltage Vdd_dig and the calDAC memory 706. Alternatively, the LPF 718 may be integrated in the calDAC memory 706. The LPF 718 suppresses noise from the low voltage supply. In some aspects, the FSM may not be specified with a low pass filter because it is turned off after the calibration. The NMOS calDAC 700 subtracts current at an output of the main DAC's MSB current source to eliminate the current amplitude errors due to random mismatch. For example, an output current (Tout) generated at the calDAC core is combined with an output current of the main DAC's MSB current source. In this configuration, the combination causes the current value in the current source of the main DAC to be corrected and is close to its ideal value.

Figure 8:
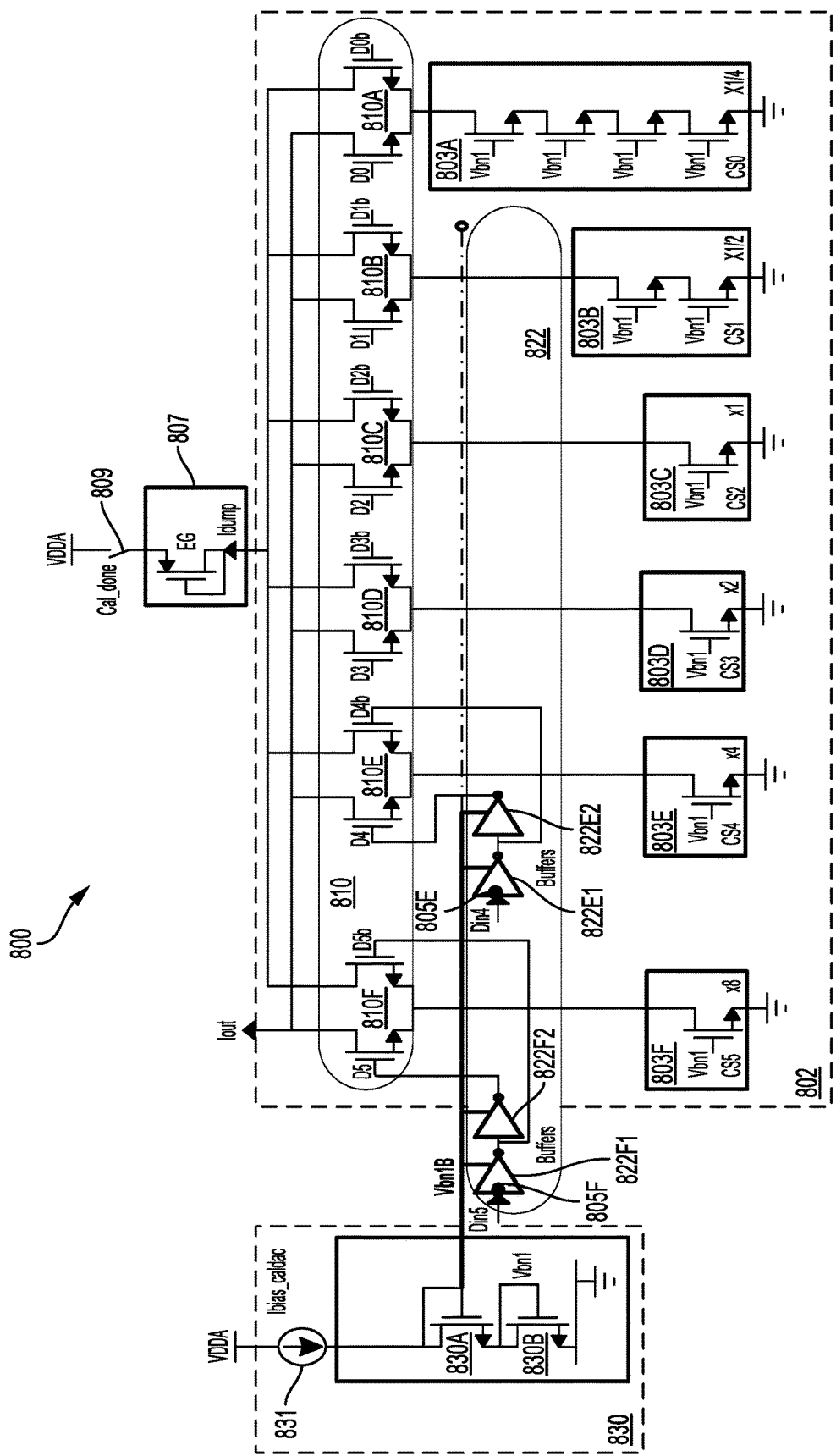
FIG. 8 illustrates an NMOS calDAC circuit according to aspects of the present disclosure.

FIG. 8 illustrates an NMOS calDAC circuit 800 according to aspects of the present disclosure. The NMOS calDAC circuit 800 includes a bias control circuit 830, an interface circuit 822 (e.g., based on a digital interface schematic), a calDAC bit element selection circuit 810 and a calDAC core 802. The interface circuit 822 is coupled between the low voltage domain and the high voltage domain of the calDAC circuit 800 and is configured to transition code signals from the low voltage domain (e.g., from calDAC memory 706) to the high voltage domain (e.g., to the calDAC core 802). For example, the code signals from the low voltage domain are received at an input of the interface circuit 822. The code signals from the low voltage domain may be received at an input node 805F of a first buffer, switch, or inverter of a set of buffers, switches, or inverters (822F1 and 822F2). Similarly, the code signals from the low voltage domain are received at an input node 805E of a first buffer, switch, or inverter of another set of buffers, switches, or inverters (822E1 and 822E2).

The bias control circuit 830 provides a bias voltage to the interface circuit 822 to control the calDAC bit element selection circuit 810. In one aspect of the disclosure, the bias control circuit 830 includes transistors 830A and 830B. The bias control circuit 830 also provides a bias for the current source transistors of calDAC element current sources 803. For example, the current source transistors of the calDAC element current sources 803 track both a gate to source voltage (Vgs) and drain to source voltage (Vds) of the bias control circuit 830 under different temperature and process conditions. The current source 831 provides the bias reference current and the current flows to a diode connected NMOS transistor 830B, which generates bias voltage Vbn1 or a Vgs for all the calDAC element current sources 803. The bias control circuit 830 can be shared for multiple calDACs.

For example, a bias voltage Vbn1B (2×Vgs) may be provided to the interface circuit 822 by the bias control circuit 830. The calDAC bit element selection circuit 810 operates in accordance with a cascode configuration instead of as a conventional switch. For example, the arrangement of the bias control circuit 830 causes the calDAC bit element selection circuit 810 (e.g., switch transistors of the calDAC bit element selection circuit 810) to be driven in accordance with the cascode configuration instead of being driven solely by a voltage from a power supply (e.g., VDDA to cause the transistor to operate as a resistor) and the ground (0V to completely turn off the transistor).

The bias voltage Vbn1B causes switch transistors, corresponding to a selected calDAC element current source, in combination with the selected calDAC element current source to act as a current source with high output resistance at a drain of the switch transistors. The cascode configuration provides isolation to devices or circuits (e.g., associated with the output of the main DAC's current source) coupled to the calDAC circuit 800. For example, a switch transistor is biased at the voltage Vbn1B when turned on, such that it behaves as cascode, which offers protection from high voltage, improves output impedance, reduces capacitive load seen by a MSB current source, and allows using a diode connected MOS 807 for Idump instead of a dump-operational transconductance amplifier (OTA).

The calDAC core 802 includes the calDAC element current sources 803 coupled to the calDAC bit element selection circuit 810. In this aspect, the current source transistors of the calDAC element current sources 803 and the switch transistors of the calDAC bit element selection circuit 810 are NMOS transistors. The current source transistors are biased by the bias voltage Vbn1 from the bias control circuit 830. A first calDAC element current source 803A is coupled to a first calDAC bit element selection circuit 810A. Similarly, second, third, fourth, fifth, and sixth calDAC element current sources 803B, 803C, 803D, 803E, and 803F are respectively coupled to calDAC bit element selection circuits 810B, 810C, 810D, 810E, and 810F. Each of the calDAC bit element selection circuits 810A, 810B, 810C, 810D, 810E, and 810F may comprise switch transistors to selectively couple the calDAC bit element selection circuits 810A, 810B, 810C, 810D, 810E, and 810F and corresponding calDAC element current sources 803A, 803B, 803C, 803D, 803E, and 803F. An output current (Tout), which is a correction current at a drain of a first set of switch transistors (D0-D5), is combined with the output of the main DAC's current source. For example, the NMOS calDAC draws current from the output of one of the main DAC's current source in accordance with the combination.

In one aspect of the disclosure, the switch transistors in each of the calDAC bit element selection circuits 810A, 810B, 810C, 810D, 810E, and 810F may be arranged in accordance with a differential configuration to speed up switching. For example, each of the calDAC bit element selection circuits 810A, 810B, 810C, 810D, 810E, and 810F may include two transistors in the differential configuration.

A second set of transistors (D0b-D5b) of the calDAC bit element selection circuits 810A, 810B, 810C, 810D, 810E, and 810F may be configured to generate a dump current (Idump) at a drain of the second set of switch transistors. The set of transistors D0b-D5b may be arranged with the first set of switch transistors D0-D5 in accordance with a differential configuration. The current (Idump) is sent or dumped to the power supply (VDDA) through a switch 809 coupled between the supply voltage VDDA and the diode connected MOS 807. The current (Idump) is a dump current from un-selected switch transistors, which can be turned off by deselecting the switch 809 after the calibration.

In one aspect, the first and the second sets of switch transistors receive a first bias (or bit) control signal (e.g., Vbn1B) and a second bias control signal (e.g., 0V) from the interface circuit 822 at the respective gates of the first and second sets of switch transistors to respectively bias or drive the first and second sets of switch transistors. For example, the first bias control signal may be an output of the first inverter 822F1 and the second bias control signal may be an output of a second inverter 822F2. For example, the switch transistor D5 receives the first bias control signal Vbn1B and the switch transistor D5b receives 0V (Vbn1B>0V), which means only one of the transistors D5 or D5b is turned at a time. Thus, the calDAC bit element selection circuit alternately generates current Tout at the drain of the switch transistor D5 or Idump at the drain of the second transistor D5b.

The interface circuit 822 may include the first and second inverters 822F1 and 822F2 associated with the sixth calDAC element current source 803F. The interface circuit 822 may also include a third inverter 822E1 and a fourth inverter 822E2 that are associated with the calDAC element current source 803E. Although only two sets of inverters are shown, aspects of this disclosure are not limited to two sets of inverters. For example, each of the calDAC element current sources 803A, 803B, 803C, 803D, 803E, and 803F may be coupled to a set of inverters through which the bit control signals are propagated to select a desirable calDAC element current source for error correction. The calDAC element current sources 803A, 803B, 803C, 803D, 803E, and 803F are respectively coupled to the calDAC bit element selection circuits 810A, 810B, 810C, 810D, 810E and 810F. For example, drains of the current transistors of the calDAC element current sources 803A, 803B, 803C, 803D, 803E and 803F are respectively coupled to sources of the switch transistors of the calDAC bit element selection circuits 810A, 810B, 810C, 810D, 810E and 810F.

Bit-0 corresponds to calDAC element current source 803A, bit-1 corresponds to calDAC element current source 803B, bit-2 corresponds to calDAC element current source 803C, bit-3 corresponds to calDAC element current source 803D, bit-4 corresponds to calDAC element current source 803E and bit-5 corresponds to calDAC element current sources 803F. Bit-0 may correspond to the LSB while bit-5 corresponds to the MSB.

To reduce the number of current source transistors for the calDAC array (e.g., the calDAC element current sources 803A, 803B, 803C, 803D, 803E, and 803F) in the calDAC core 802, the current source transistors of the calDAC are configured in accordance with a binary weighted configuration, but non-linear binary schematic. For example, the current source transistors of the calDAC element current sources 803A, 803B, 803C, 803D, 803E, and 803F are in the non-binary weighted configuration where a unit current source is applied to bit-2 instead of the LSB (bit-0), which reduces a total number of unit current sources. Bit-1 and bit-0 current sources are implemented by adding the unit current source in series, instead of in parallel. For example, instead of the conventional binary configuration where a progression from the LSB to the MSB is $2^0, 2^1, \ldots, 2^3, 2^4,$ and $2^5$ of unit cell, in the non-linear binary schematic of FIG. 8, the progression (from LSB to MSB) is from $2^{-2}, 2^{-1}, 2^0, 2^1, 2^2, 2^3$. Thus, a total number of unit current sources for a 6-bit calDAC, according to aspects of the present disclosure, is 4+2+1+2+4+8=21 units instead of 63 units for a conventional binary configuration. This aspect of the present disclosure can be applied to any N-bit calDAC. For example, in some aspects, the unit current source can be implemented at the bit (N−1)/2 if N is an odd number and N/2−1 if N is even number.

Figure 9:
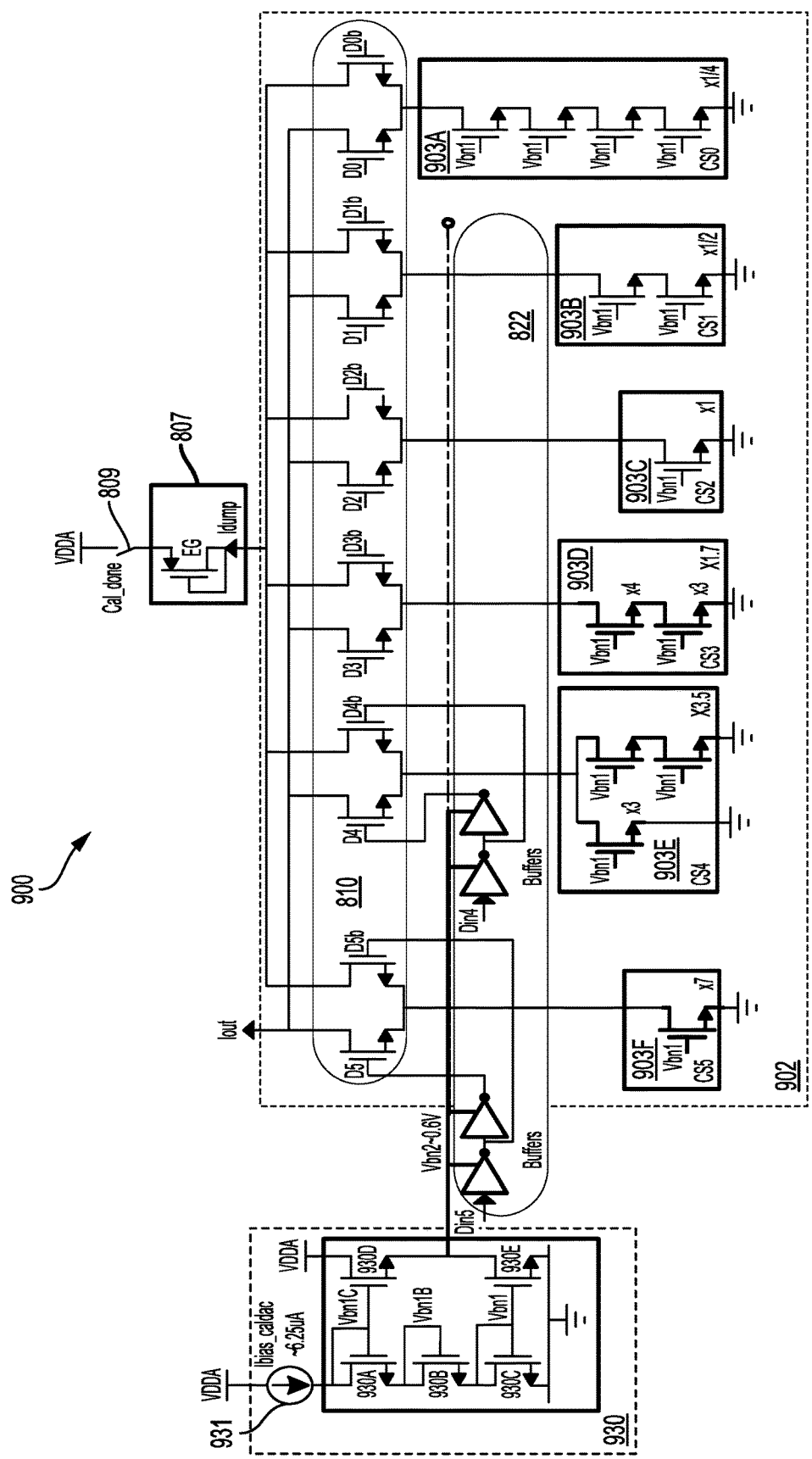
FIG. 9 illustrates an NMOS calDAC circuit including a current mirror based bias control circuit and calDAC element current sources with transistors arranged in accordance with a non-linear binary schematic, according to aspects of the present disclosure.

FIG. 9 illustrates an NMOS calDAC circuit 900 including a current mirror based bias/control circuit 930 and calDAC element current sources 903 with current source transistors arranged in accordance with a non-linear or overlapping binary schematic. For illustrative purposes, some of the labelling and numbering of the devices and features of FIG. 9 are similar to those of FIG. 8. For example, similar to current source transistors of the calDAC element current sources 803 of FIG. 8, the current source transistors of the calDAC element current sources 903 of FIG. 9 are NMOS transistors. Moreover, the current source transistors of the of the calDAC element current sources 903A (bit-0), 903B (bit-1), and 903C (bit-2) of FIG. 9 are arranged in the same binary weighted configuration as the transistors of the calDAC element current sources 803A (bit-0), 803B (bit-1), and 803C (bit-2) of FIG. 8. However, the transistors of the calDAC element current sources 903D (bit-3), 903E (bit-4), and 903F (bit-5) of FIG. 9 are arranged in a different non-binary weighted configuration (or an overlapping configuration) relative to the current source transistors of the calDAC element current sources 803D (bit-3), 803E (bit-4), and 803F (bit-5) of FIG. 8. In addition, the bias/control circuit 930 of FIG. 9 is different from the bias control circuit 830 and the non-linear binary schematic of FIG. 8.

For example, the bias/control circuit 930 includes bias/control transistors 930A, 930B, 930C, 930D and 930E arranged in accordance with a current mirror to track current source transistors of the calDAC core 902. The current source transistors include transistors of the calDAC element current sources 903A, 903B, 903C, 903D, 903E and 903F. The reference bias current 931 flows to bias/control transistors (or diode connected NMOS transistors) 930A, 930B, and 930C, which generates a bias voltage Vbn1 (Vgs), Vbn1B (2Vgs), and Vbn1C (3Vgs). Through a bias/control transistor 930D (e.g., source follower NMOS transistor), the bias voltage Vbn2 tracks the bias voltage Vbn1B. The bias voltage Vbn2 for the calDAC bit element selection circuits 810 (e.g., switch transistors) is based on a tracked gate to source voltage (Vbn1) of the current source transistors of the calDAC element current sources 903 plus a gate to source voltage of a replica of the switch transistors. In this aspect, the bias voltage for the switch transistors may be buffered using a source-follower configuration to achieve faster settling time at an output of one or more inverters and to tolerate leakage current from the one or more inverters without affecting bias current. The gate to source voltage (Vgs) and drain to source voltage (Vds) of current source transistors of the calDAC element current sources 903 have equal value and track those of the bias/control transistor 930C under different temperature and process conditions. This arrangement guarantees that the current source in the calDAC matches the bias current over process, supply, and temperature variation.

In one aspect of the disclosure, the current source transistors of bit-3, bit-4, and bit-5 (MSB) are resized to generate overlap in a calDAC transfer function. For example, the transistors of bit-3 are arranged in a series and parallel combination of unit current sources to effectively achieve one point seven times (~1.7×) current compared to the unit current source, which is slightly less than two times (2×) the unit current source. The transistors of bit-4 and bit-5 are respectively scaled to 3.5× (<4×) and 7× (<8×) the current compared to the unit current source. Thus, in the MSB (bit-5) of FIG. 9, for example, 7-units (x7) are implemented for the current source instead of 8-units, as in the MSB of FIG. 8.

This arrangement uses the non-linear binary schematic with overlap and non-linearity to relax mismatch specification on the calDAC element current sources 903.

Figure 10:
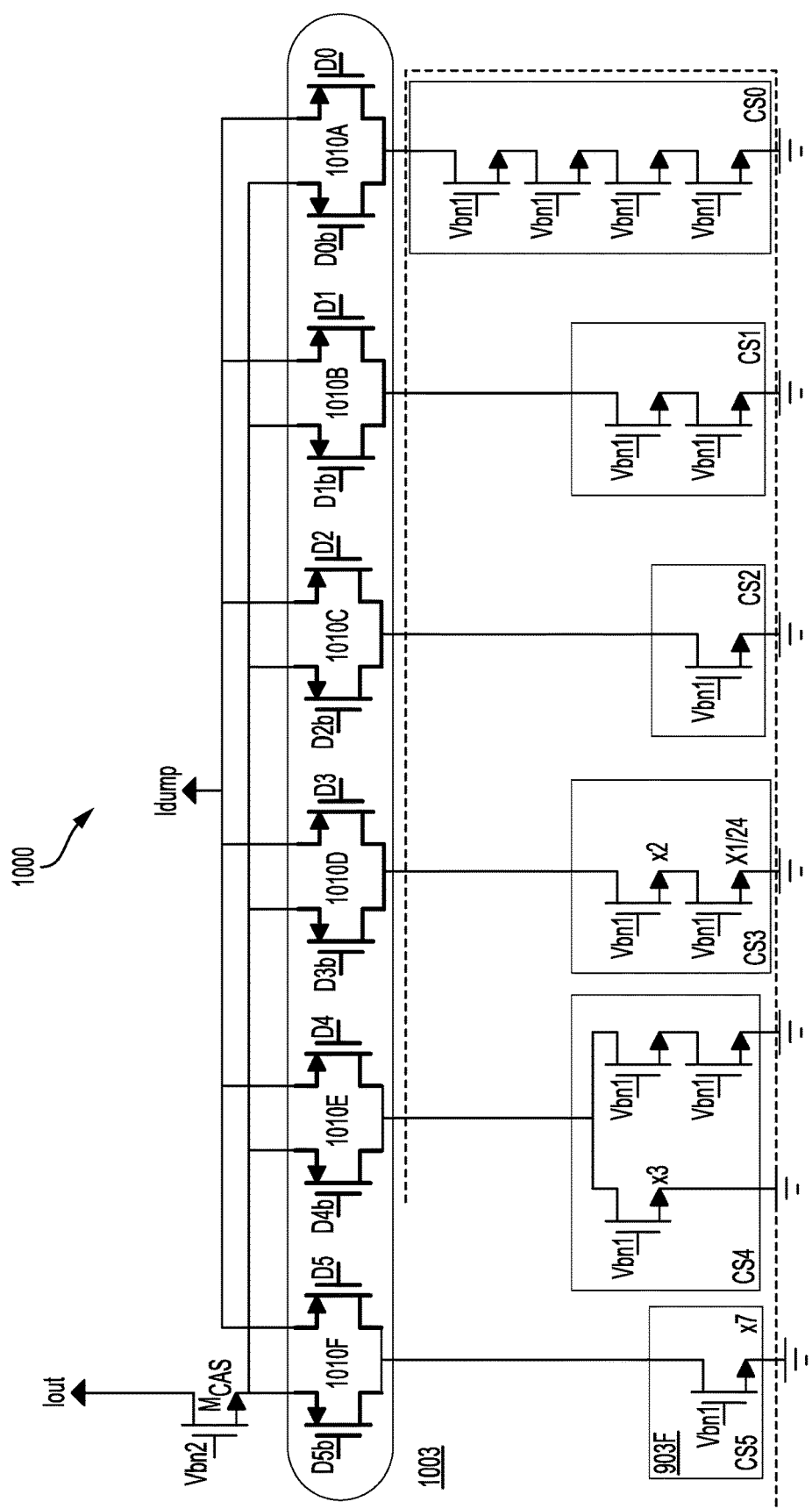
FIG. 10 illustrates an NMOS calDAC circuit with PMOS switch transistors according to aspects of the present disclosure.

FIG. 10 illustrates an NMOS calDAC 1000 with PMOS switch transistors according to aspects of the present disclosure. For illustrative purposes, some of the labelling and numbering of the devices and features of FIG. 10 are similar to those of FIG. 9. For example, the current source transistors of the calDAC element current sources 1003 of FIG. 10 may be arranged in the same non-binary weighted configuration as the transistors of the calDAC element current sources 803 or 903 of FIG. 8 or 9. In this aspect, the NMOS calDAC 1000 is implemented with one or more PMOS switch transistors of calDAC bit element selection circuits 1010A, 1010B, 1010C, 1010D, 1010E, and 1010F). However, noise from the low voltage domain is alleviated because the one or more PMOS switch transistors are connected to ground when the switch is on. An NMOS cascode ($M_{CAS}$) can be added even though the addition consumes additional area, and it is biased using a similar bias control circuit as previously described with respect to FIGS. 8 and 9. The NMOS cascode ($M_{CAS}$) is shared between the PMOS switch transistors of the calDAC bit element selection circuits 1010A, 1010B, 1010C, 1010D, 1010E, and 1010F).

Aspects of the present disclosure achieve calDAC area reduction (e.g., both analog and digital domain). Aspects of this disclosure also achieve better performance due to smaller maximum residual error compared to existing calDACs and easier timing verification from the FSM to the calDAC memory, embedded in a digital design flow. The cascode implementation (e.g., cascode switch) of the disclosure offers higher calDAC output impedance, and allows for dump-OTA removal. The NMOS current sources in the calDAC benefits from additional voltage headroom compared to PMOS calDAC current sources.

Figure 11:
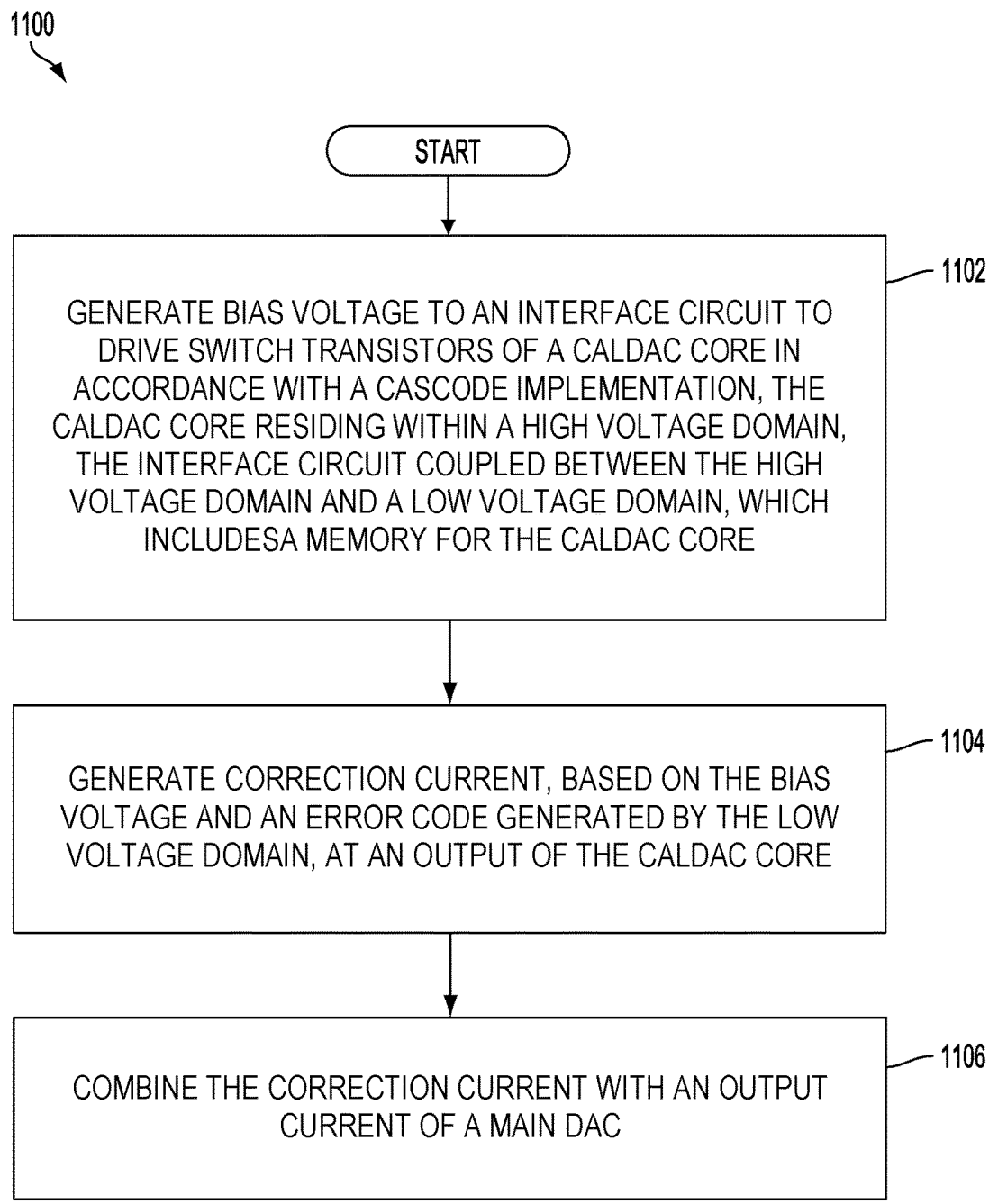
FIG. 11 depicts a simplified flowchart of a method of calibrating a digital to analog converter according to aspects of the disclosure.

FIG. 11 depicts a simplified flowchart 1100 of a method of calibrating a digital to analog converter. At block 1102, a bias voltage to an interface circuit is generated to drive switch transistors of a calibrating digital to analog converter core in accordance with a cascode implementation. The calibrating digital to analog converter core resides within a high voltage domain. The interface circuit is coupled between the high voltage domain and a low voltage domain. The low voltage domain includes a memory for the calibrating digital to analog converter core. At block 1104, a correction current is generated based on the bias voltage and an error code generated by the low voltage domain at an output of the calibrating digital to analog converter core. At block 1106, the correction current is combined with an output current of the digital to analog converter.

According to one aspect of the present disclosure, a calibrating digital to analog converter (calDAC) architecture is described. The calDAC architecture includes means for interfacing the calibrating digital to analog converter core and the low voltage domain. The calDAC architecture also includes means for generating a bias voltage to the interface circuit. The interfacing means may, for example, be the interface circuit 722, and/or the interface circuit 822. The bias voltage generating means may be, for example, the bias control circuit 830 and/or the bias/control circuit 930. In another aspect, the aforementioned means may be any module or any apparatus or material configured to perform the functions recited by the aforementioned means.

FIG. 12 is a block diagram showing an exemplary wireless communication system in which a configuration of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225B, and 1225C that include the disclosed calibrating digital to analog converter (calDAC) architecture. It will be recognized that other devices may also include the disclosed calDAC architecture, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the calDAC architecture.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A calibrating digital to analog converter (calDAC) architecture, comprising:
   a low voltage domain including a calibrating digital to analog converter memory; and
   a high voltage domain coupled to the low voltage domain, the high voltage domain comprising,
   a calibrating digital to analog converter core,
   an interface circuit between the calibrating digital to analog converter core and the low voltage domain, and
   a bias control circuit coupled to the interface circuit to generate a bias voltage for the interface circuit to drive switch transistors of the calibrating digital to analog converter core, the calDAC architecture configured to generate a calibration signal to a main digital to analog converter to calibrate the main digital to analog converter.

2. The calibrating digital to analog converter architecture of claim 1, in which the bias control circuit generates the bias voltage in accordance with a cascode implementation.

3. The calibrating digital to analog converter architecture of claim 1, in which the bias control circuit comprises a current mirror to track current source transistors of the calibrating digital to analog converter core to a reference current in the bias control circuit.

4. The calibrating digital to analog converter architecture of claim 3, in which the bias control circuit comprises transistors arranged such that the current source transistors of the calibrating digital to analog converter core tracks a biasing condition of a reference transistor.

5. The calibrating digital to analog converter architecture of claim 4, in which the current source transistors are arranged in accordance with a binary configuration using a non-linear or overlapping transfer function configuration.

6. The calibrating digital to analog converter architecture of claim 4, in which the current source transistors are arranged in accordance with a non-linear binary configuration using a non-linear or overlapping transfer function configuration.

7. The calibrating digital to analog converter architecture of claim 1, in which the low voltage domain comprises a digital domain including a finite state machine (FSM) coupled to the calibrating digital to analog converter memory.

8. The calibrating digital to analog converter architecture of claim 1, in which the high voltage domain comprises an analog domain.

9. The calibrating digital to analog converter architecture of claim 1, in which the low voltage domain further comprises a low-pass filter coupled to the calibrating digital to analog converter memory to suppress noise from a low voltage supply.

10. The calibrating digital to analog converter architecture of claim 1, in which the interface circuit comprises buffers to bias the switch transistors of the calibrating digital to analog converter core, to provide noise isolation from the low voltage domain, and to level-shift digital data from the calibrating digital to analog converter memory to the calibrating digital to analog converter core.

11. A method of calibrating a digital to analog converter, comprising:
   generating a bias voltage to an interface circuit to drive switch transistors of a N-type metal oxide semiconductor (NMOS) calibrating digital to analog converter (calDAC) core, the NMOS calDAC core residing within a high voltage domain, the interface circuit coupled between the high voltage domain and a low voltage domain, which includes a memory for the NMOS calDAC core;
   generating a correction current based at least in part on the bias voltage and an error code generated by the low voltage domain at an output of the NMOS calDAC core, and
   combining the correction current with an output current of a main digital to analog converter.

12. The method of claim 11, in which driving or biasing the switch transistors further comprises:
   tracking an operating condition of current source transistors of the NMOS calDAC core in the high voltage domain; and
   biasing the switch transistors based at least in part on the tracking.

13. The method of claim 11, further comprising providing noise isolation between the low voltage domain and the high voltage domain.

14. A calibrating digital to analog converter (calDAC) architecture, comprising:
   a low voltage domain including a calibrating digital to analog converter memory; and
   a high voltage domain coupled to the low voltage domain, the high voltage domain comprising,
   a calDAC core,
   means for interfacing the calibrating digital to analog converter core and the low voltage domain, and
   means for generating a bias voltage to an interface circuit to drive switch transistors of the calDAC core, the calDAC architecture configured to generate a calibration signal to a main digital to analog converter to calibrate the main digital to analog converter.

15. The calibrating digital to analog converter architecture of claim 14, in which the bias voltage generating means generates the bias voltage in accordance with a cascode implementation.

16. The calibrating digital to analog converter architecture of claim 14, in which the low voltage domain further comprises a digital domain including a finite state machine (FSM) coupled to the calibrating digital to analog converter memory.

17. The calibrating digital to analog converter architecture of claim 14, in which the high voltage domain comprises an analog domain.

18. The calibrating digital to analog converter architecture of claim 14, in which the low voltage domain further comprises a low-pass filter coupled to the calibrating digital to analog converter memory to suppress noise from a low voltage supply.

* * * * *